United States Patent
Koifman et al.

[19]

[11] Patent Number: 5,828,264
[45] Date of Patent: Oct. 27, 1998

[54] TWO-STAGE OPERATIONAL AMPLIFIER CIRCUIT WITH WIDE OUTPUT VOLTAGE SWINGS

[75] Inventors: Vladimir Koifman, Rama-Gan; Yachin Afek, Kfar Saba, both of Israel

[73] Assignee: Motorola, Inc., Schaumburg, Ill.

[21] Appl. No.: 569,038

[22] Filed: Dec. 7, 1995

[30] Foreign Application Priority Data

Dec. 8, 1994 [GB] United Kingdom .................... 9424941

[51] Int. Cl.[6] .............................. H03F 1/30; H03F 1/34
[52] U.S. Cl. ......................... 327/562; 327/352; 330/103; 330/109; 330/294
[58] Field of Search ..................... 327/560, 561, 327/562, 563, 362, 266, 274, 555, 334, 557, 558, 559; 330/99, 103, 109, 294

[56] References Cited

U.S. PATENT DOCUMENTS

| | | | |
|---|---|---|---|
| 3,781,697 | 12/1973 | Bruinshorst et al. | 327/554 |
| 4,227,157 | 10/1980 | Davies et al. | 330/265 |
| 4,229,619 | 10/1980 | Takahashi et al. | 330/109 |
| 4,713,625 | 12/1987 | Whatley | 330/297 |
| 5,079,514 | 1/1992 | Mijuskovic | 330/253 |
| 5,204,639 | 4/1993 | Moore et al. | 330/294 |
| 5,315,266 | 5/1994 | Lorenz | 330/294 |
| 5,561,394 | 10/1996 | Hagino | 330/294 |

FOREIGN PATENT DOCUMENTS 2023019 12/1970 Germany .................... 330/109

*Primary Examiner*—Timothy P. Callahan
*Assistant Examiner*—Terry L. Englund
*Attorney, Agent, or Firm*—Rennie William Dover

[57] ABSTRACT

A two stage operational amplifier circuit comprises a first stage (31) having an input (2, 4) and an output, and a second stage (33) having an input and an output (19). The second stage input is coupled to receive the first stage output. A feedback path (41, 45, 47, 51) is coupled between the output and the input of the second stage. The feedback path (41, 45, 47, 51) comprises a low-frequency compensation path (41, 45) and high-frequency compensation path (45, 47, 51). The feedback path (41, 45, 47, 51) is compensated such that the frequency response of the second output of the second stage is substantially 6 dB per octave throughout the high-frequency region.

7 Claims, 2 Drawing Sheets

5,828,264

TWO-STAGE OPERATIONAL AMPLIFIER CIRCUIT WITH WIDE OUTPUT VOLTAGE SWINGS

FIELD OF THE INVENTION

This invention relates to two-stage operational amplifier circuits and particularly but not exclusively to two-stage operational amplifier circuits for use with low-voltage applications.

BACKGROUND OF THE INVENTION

Typically, two-stage operational amplifier circuits have frequency compensation including a resistor between the stages of the circuit. The resistor reduces direct high-frequency signal propagation from a first stage of the operational amplifier circuit to an output. However, if the value of the resistor is too large, the circuit settling time is greatly impaired. Thus the value of the resistor must be carefully chosen (matched) such that high-frequency signal propagation is negligible, whilst the circuit settles at an acceptable speed.

A problem with such circuits is that process fluctuations associated with mass production techniques mean that the resistor value is not accurately matched for each circuit and hence the trade off between settling time and high-frequency signal propagation cannot be achieved satisfactorily for each circuit manufactured.

Known solutions to this problem include the use of transistors in various configurations. For example, a transistor in resistance mode provides the required resistance mentioned above, and as the transistor is subject to the same process fluctuations as the other elements of the circuit, it will be inherently well matched. However, the transistor requires high biasing voltage which makes the circuit inappropriate for use in low-voltage applications. Other configurations of transistors have other problems associated with them, including the need for high bias current and reduced output voltage range.

This invention seeks to provide a two-stage operational amplifier circuit which mitigates the above mentioned disadvantages.

SUMMARY OF THE INVENTION

According to the present invention there is provided a two stage operational amplifier circuit comprising; a first stage having a first input and a first output; a second stage having a second input and a second output, the second input being coupled to the first output; a feedback path coupled between the second output and the second input, the feedback path comprising a low-frequency compensation path and high-frequency compensation path, wherein the transfer function of the feedback path allows large output voltage swings with small circuit supply voltage levels.

Preferably the low-frequency compensating path comprises a first transistor, a first capacitor and a first current source, arranged to feed back a low-frequency component from the second output to the second input.

The high-frequency compensating path preferably comprises a second transistor, a second capacitor and a second current source, arranged as a current follower to feed back a high-frequency component from the second output to the second input. Preferably the high-frequency compensating path also includes the first capacitor.

The first stage preferably includes a current mirror. Preferably the first stage is a differential amplifier stage and the first output is a single-ended output.

The second stage is preferably a single-ended inverting stage, and the second output is a single-ended output having a passband region frequency response of substantially 6 dB per octave.

In this way problems such as the need for a high biasing voltage or high bias current are overcome, providing a two-stage operational amplifier circuit for use in low-voltage applications.

BRIEF DESCRIPTION OF THE DRAWINGS

An exemplary embodiment of the invention will now be described with reference to the drawings in which.

DETAILED DESCRIPTION OF A PREFERRED EMBODIMENT

Figure 1:
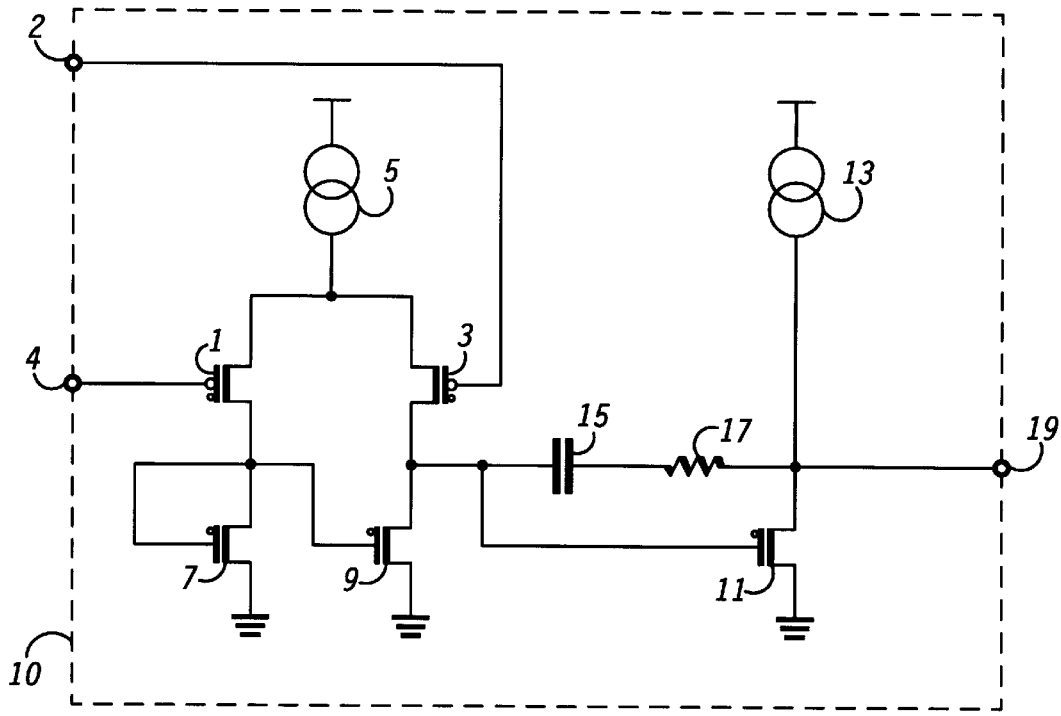
FIG. 1 and FIG. 2 show prior art two-stage operational amplifier circuits.

Referring to FIG. 1, there is shown a prior art two-stage operational amplifier circuit 10 comprising a first stage and a second stage. The first stage is a differential stage and consists of a differential pair of transistors 1 and 3, each having a gate, a source and a drain terminal. The gate terminals of the transistors 1 and 3 are coupled to input terminals 4 and 2 respectively of the first stage. A current source 5 is coupled to the source terminals of the transistors 1 and 3. A current mirror formed by transistors 7 and 9 is coupled to the drain terminals of the transistors 1 and 3 to create a single-ended differential output of the first stage.

The second stage is an inverting single-ended stage and comprises a transistor 11, having a source, gate and a drain terminal and coupled via the source terminal to a current source 13 and to a single ended output terminal 19, thus forming the second stage. The gate terminal of the transistor 11 forms an input of the second stage and is coupled to the output of the first stage.

A compensating capacitor 15 provides a compensating path between the input and output of the second stage, thus defining a transfer function of the operational amplifier circuit 10 and providing stability. At high frequencies the associated impedance of the compensating capacitor 15 becomes very small and the compensating path, if only comprising the capacitor 15, would therefore become a virtual short circuit between the input and the output of the second stage. The second stage input signal would reach the output as a non-inverted signal and the operational amplifier would be unstable. In order to prevent this a resistor 17 is coupled in series with the capacitor 15. The impedance of the compensating path now has a lower limit at high frequencies, that being the value of the resistor 17. If the value of the resistor 17 is chosen correctly, the operational amplifier phase does not erroneously invert at higher frequencies.

In order to provide a good transient response, the value of the resistor 17 must be matched very closely to certain circuit parameters, such as the capacitances and transconductances of the transistors of the circuit. However, these parameters vary from circuit to circuit, due to tolerances in the semiconductor material and in the circuit manufacturing processes. Therefore matching is hard to achieve and some circuits may have a rather long non-monotonic transient response, whilst others are unstable.

Figure 2:
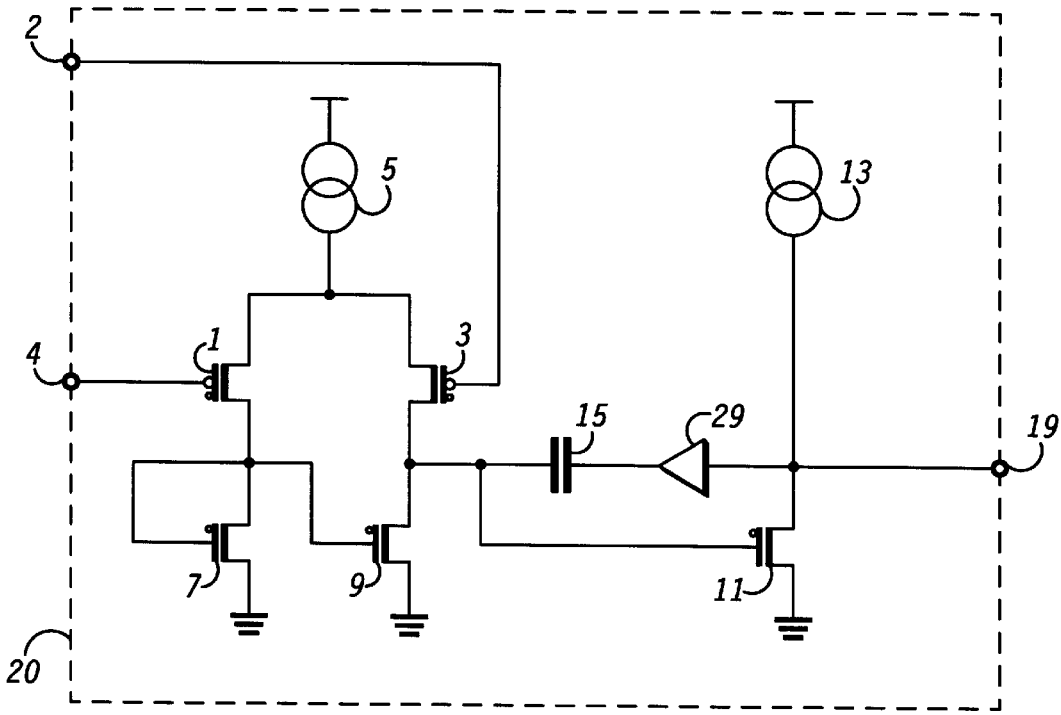

Referring also to FIG. 2, a second prior art circuit is shown, with the same components and reference numerals as shown in FIG. 1, with the compensating path including a unity-gain buffer 29, coupled in series with the capacitor 15 in place of the resistor 17 of FIG. 1. The unity-gain buffer 29 transfers feedback signals from the output to second stage input, but prevents direct signal propagation in the opposite direction.

This second prior art circuit works well at high voltage supply levels. However, the unity-gain buffer 29 cannot satisfactorily provide a large output voltage swing for very low supply voltage levels. Therefore the use of a unity gain buffer in the compensating path does not work effectively in low-voltage supply applications.

Figure 3:
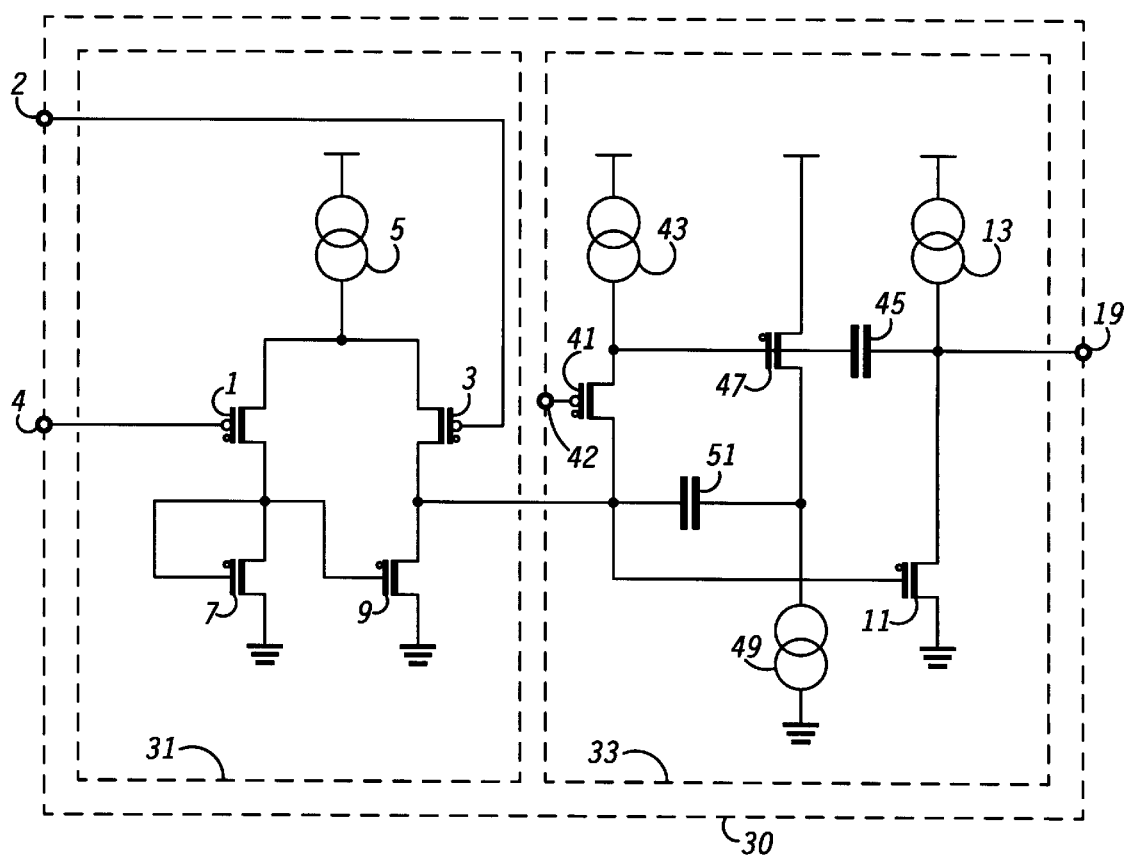
FIG. 3 shows a preferred embodiment of a two-stage operational amplifier circuit in accordance with the invention.

Referring now to FIG. 3, there is shown a two stage operational amplifier circuit 30, comprising a first stage 31 and a second stage 33, having the same components and reference numerals as the first and second stages shown in FIG. 1 and FIG. 2, but without the capacitor 15, resistor 17 or unity-gain buffer 29. Instead, the compensating path of the second stage 33 comprises a low-frequency compensating path or portion, and a high-frequency compensating path or portion.

The low-frequency compensating path is formed by a transistor 41, having source, gate and drain terminals. The source terminal of the transistor 41 is coupled to a current source 43 and to the output terminal 19 via a compensating capacitor 45. The current source 43 provides a very low current in order not to reduce the dynamic resistance at the input of the second stage, ensuring a high DC gain and reducing noise within the entire circuit 30. The gate terminal is coupled to a DC bias voltage 42, which is arranged to maintain the transistor 41 in a saturation configuration. The drain of the transistor 41 is coupled to the input of the transistor 11.

The dynamic resistance of the source terminal of transistor 41 is much lower than the impedance of compensating capacitor 45 at low frequencies. Therefore the source terminal of the transistor 41 forms an AC virtual ground. Low-frequency components of the feedback current therefore flow from the output terminal 19 through the compensating capacitor 45 and transistor 41 to the input of second stage 33.

At higher frequencies the impedance of capacitor 45 becomes lower than the dynamic impedance of the source terminal of transistor 41. There is therefore no AC virtual ground on the source of transistor 41, but instead only the high-frequency component of the output voltage.

The high-frequency compensating path is formed with a transistor 47, having source, gate and drain terminals. The drain terminal is coupled to a current source 49, thereby forming a source follower. The gate terminal of the transistor 47 is connected to the source terminal of transistor 41, such that it receives the high-frequency component of the output signal, that being the component which is not transferred to the drain of the transistor 41. This component is followed on the source of transistor 47 and then fed back to the input of the second stage through a capacitor 51. The transistor 47 can have a large source current without having any influence on the overall DC gain and noise level of the circuit 30 because its source current is separated from the forward current path. The dynamic source resistance of the transistor 47 is much lower than the impedance of the capacitor 51 even at high frequencies. This greatly improves the frequency compensation quality of the circuit 30.

In this way the separate low-frequency and high-frequency compensating paths allow for a low-frequency component of the compensating signal, which usually has a large amplitude, processed over a large signal range. Conversely, a high-frequency component of the compensating signal, close to the unity gain frequency of the operational amplifier circuit 30, which usually has a much lower amplitude is limited by the slew rate of the high-frequency compensating path.

It will be appreciated by a person skilled in the art that alternate embodiments to the one described above may be achieved. For example, while the output terminal 19 of the operational amplifier circuit 30 is a single-ended output, the proposed solution may easily be implemented in a fully-differential operational amplifier circuit, having a differential output.

We claim:

1. A two stage operational amplifier circuit, comprising:

a first stage having a first input and a first output;

a second stage having a second input and a second output, the second input being coupled to the first output; and a feedback path coupled between the second output and the second input, the feedback path comprising a first frequency range compensation portion and a second frequency range compensation portion, wherein the first frequency range compensation portion includes a first transistor, a first capacitor, and a first current source, and wherein the first transistor and the first capacitor have an associated time constant such that the first frequency compensation portion feeds back frequency components having a value less than a value of a reciprocal of the time constant and the second frequency compensation portion feeds back frequency components having a value greater than the value of the reciprocal of the time constant.

2. The circuit of claim 1 wherein the second frequency range compensation portion comprises a second transistor, a second capacitor and a second current source, arranged as a current follower to feed back a frequency component from the second output to the second input, wherein the frequency component fed back has a value greater than the value of the reciprocal of the time constant.

3. The circuit of claim 2 wherein the second frequency range compensation portion also includes the first capacitor.

4. The circuit of claim 1 wherein the first stage includes a current mirror.

5. The circuit of claim 1 wherein the first stage is a differential amplifier stage and the first output is a single-ended output.

6. The circuit of claim 1 wherein the second stage is a single-ended inverting stage, and the second output is a single-ended output having a passband region frequency response of substantially 6 dB per octave.

7. The circuit of claim 1, wherein the first frequency range compensation portion is a low-frequency compensation portion and the second frequency compensation portion is a high-frequency portion.

* * * * *